(12) United States Patent
Lee et al.

(10) Patent No.: US 10,546,909 B2
(45) Date of Patent: Jan. 28, 2020

(54) DISPLAY PANEL AND DISPLAY PANEL TEST SYSTEM

(71) Applicant: Samsung Display Co., Ltd., Yongin-si, Gyeonggi-do (KR)

(72) Inventors: Daegeun Lee, Hwaseong-si (KR); Kyung-Mok Lee, Bucheon-si (KR); Wuhyen Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/937,455

(22) Filed: Mar. 27, 2018

(65) Prior Publication Data

US 2018/0286939 A1    Oct. 4, 2018

(30) Foreign Application Priority Data

Mar. 29, 2017    (KR) .................. 10-2017-0040216

(51) Int. Cl.
*H01L 27/32*    (2006.01)
*H01L 51/52*    (2006.01)
(Continued)

(52) U.S. Cl.
CPC ......... *H01L 27/3276* (2013.01); *G09G 3/006* (2013.01); *H01L 22/32* (2013.01);
(Continued)

(58) Field of Classification Search
CPC ..... H01L 27/3276; H01L 22/34; H01L 22/32; H01L 24/32; H01L 51/5253;
(Continued)

(56) References Cited

U.S. PATENT DOCUMENTS 9,013,197 B2    4/2015    Lee
9,460,646 B2   10/2016    Hwang et al.
(Continued)

FOREIGN PATENT DOCUMENTS

JP    2013-182128 A    9/2013
KR   10-2011-0060249   6/2011
KR   10-2014-0055674   5/2014

*Primary Examiner* — Karen Kusumaker
*Assistant Examiner* — Adam S Bowen
(74) *Attorney, Agent, or Firm* — Lewis Roca Rothgerber Christie LLP

(57) ABSTRACT

A display panel measures a contact resistance of an adhesive portion to evaluate adhesion quality of an integrated circuit mounted thereon. The display panel includes a plurality of light-emitting elements, a first pad part including a plurality of first effective pads electrically connected to the light-emitting elements, and n (n being a natural number equal to or greater than 2) first measuring pads insulated from the light-emitting elements, a conductive adhesive film on the first pad part and including a plurality of conductive balls, an integrated circuit on the conductive adhesive film, and including an internal line electrically connected to the first measuring pads by the conductive balls, and a second pad part including a plurality of second effective pads electrically connected to the first effective pads, and 2n second measuring pads electrically connected to the first measuring pads.

16 Claims, 11 Drawing Sheets

(51) Int. Cl.
  *H01L 21/66* (2006.01)
  *G09G 3/00* (2006.01)
  *H01L 23/00* (2006.01)
  *G09G 3/3225* (2016.01)
  *H01L 29/786* (2006.01)

(52) U.S. Cl.
  CPC .......... *H01L 24/32* (2013.01); *H01L 51/5253* (2013.01); *G09G 3/3225* (2013.01); *H01L 29/7869* (2013.01); *H01L 29/78666* (2013.01); *H01L 29/78669* (2013.01); *H01L 2224/2929* (2013.01); *H01L 2224/32145* (2013.01); *H01L 2251/5338* (2013.01); *H01L 2924/069* (2013.01); *H01L 2924/0635* (2013.01); *H01L 2924/0665* (2013.01); *H01L 2924/1426* (2013.01)

(58) Field of Classification Search
  CPC ............. H01L 27/3244; H01L 51/0031; H01L 29/78666; H01L 2924/1426; H01L 2224/32145; H01L 2251/5338; H01L 2924/0665; H01L 2924/069; H01L 2924/0635; H01L 2224/2929; H01L 29/78669; H01L 29/7869; G09G 3/006; G09G 2300/0426; G09G 3/3225
  USPC .......................................................... 257/40
  See application file for complete search history.

(56) References Cited

U.S. PATENT DOCUMENTS

| | | | | |
|---|---|---|---|---|
| 2011/0068346 | A1* | 3/2011 | Lee | H01L 27/3276 257/72 |
| 2014/0117998 | A1* | 5/2014 | Hwang | G09G 3/006 324/511 |
| 2015/0366049 | A1* | 12/2015 | Lee | G02F 1/13458 361/749 |
| 2017/0261542 | A1* | 9/2017 | Onishi | G01R 31/04 |

* cited by examiner

DISPLAY PANEL AND DISPLAY PANEL TEST SYSTEM

CROSS-REFERENCE TO RELATED APPLICATION

This application claims priority to, and the benefit of, Korean Patent Application No. 10-2017-0040216, filed on Mar. 29, 2017, the contents of which in its entirety is hereby incorporated by reference.

BACKGROUND

1. Field

The present disclosure relates to a display panel on which a contact resistance test is performed and a display panel test system.

2. Description of the Related Art

An integrated circuit that drives light-emitting elements in a display device is mounted on a display panel. In recent years, a chip-on-glass (COG) method and a chip-on-plastic (COP) method, in which the integrated circuit is directly mounted on the display panel, are widely used because a structure of the COG method and the COP method is simple, and because a ratio of a display area to a non-display area on the display panel increases.

Meanwhile, when the integrated circuit is directly mounted on the display panel by the COG or COP method, a contact resistance occurs between the display panel and the integrated circuit. When the contact resistance increases, performance of the display panel is degraded. Accordingly, when the display panel is manufactured, the contact resistance is measured to check the performance of the display panel.

SUMMARY

The present disclosure provides a display panel having a structure capable of reducing the number of pads used to measure a contact resistance of the display panel.

The present disclosure also provides a display panel test system capable of measuring the contact resistance at multiple points using the pads.

Embodiments of the inventive concept provide a display panel including a plurality of light-emitting elements, a first pad part including a plurality of first effective pads electrically connected to the light-emitting elements, and n (n being a natural number equal to or greater than 2) first measuring pads insulated from the light-emitting elements, a conductive adhesive film on the first pad part and including a plurality of conductive balls, an integrated circuit on the conductive adhesive film, and including an internal line electrically connected to the first measuring pads by the conductive balls, and a second pad part including a plurality of second effective pads electrically connected to the first effective pads, and 2n second measuring pads electrically connected to the first measuring pads.

The integrated circuit may be configured to apply an electrical signal to the light-emitting elements.

The integrated circuit may be mounted by a chip-on-glass (COG) method or a chip-on-plastic (COP) method.

The display panel may further include a printed circuit board electrically connected to the second pad part.

The printed circuit board may be mounted by the chip-on-glass (COG) method or the chip-on-plastic (COP) method.

Each of the first measuring pads may be electrically connected to two respective ones of the second measuring pads.

n may be equal to 2, the first pad part may further include a third measuring pad electrically connected to the internal line, and the second pad part may further include a fourth measuring pad electrically connected to the third measuring pad.

n may be equal to 3.

n may be equal to 4.

The first effective pads and the first measuring pads may be arranged in three rows.

The first effective pads and the first measuring pads may be arranged in four rows.

A bending axis may be defined between the first pad part and the light-emitting elements, and the display panel may be bent with respect to the bending axis.

The internal line may be insulated from other lines in the integrated circuit.

Each of the light-emitting elements may include an organic light-emitting layer.

Embodiments of the inventive concept further provide a display panel test system including a display panel including a plurality of light-emitting elements, a test pad part including n (n is a natural number equal to or greater than 2) test pads insulated from the light-emitting elements, a conductive adhesive film on the n test pads, and including a plurality of conductive balls, an integrated circuit on the conductive adhesive film and including an internal line electrically connected to the test pads by the conductive balls, and an input pad part including 2n input pads electrically connected to the test pads, and a test device electrically connected to the input pads to measure a contact resistance of the test pads, the conductive adhesive film, and the internal line.

The test device may be configured to apply a current between two of the input pads, and may be configured to measure a voltage between two others of input pads.

n may be equal to 3.

The test pads may include a first test pad, a second test pad, and a third test pad, and the input pads may include a first input pad electrically connected to the first test pad, a second input pad electrically connected to the first test pad, a third input pad electrically connected to the second test pad, a fourth input pad electrically connected to the second test pad, a fifth input pad electrically connected to the third test pad, and a sixth input pad electrically connected to the third test pad.

The test device may be configured to apply a current between the first input pad and the third input pad, and measure the voltage between the second input pad and the fifth input pad to measure the contact resistance of the first test pad, the conductive adhesive film, and the internal line, to apply a current between the third input pad and the first input pad, and measure the voltage between the fourth input pad and the fifth input pad to measure the contact resistance of the second test pad, the conductive adhesive film, and the internal line, and to apply a current between the fifth input pad and the first input pad, and measure the voltage between the sixth input pad and the third input pad to measure the contact resistance of the third test pad, the conductive adhesive film, and the internal line.

According to the above, the number of the pads used to measure the contact resistance of the integrated circuit mounted on the display panel in the COG method or the COP method may be reduced.

In addition, the number of the pads suitable for measuring the contact resistance at plural points may be reduced.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
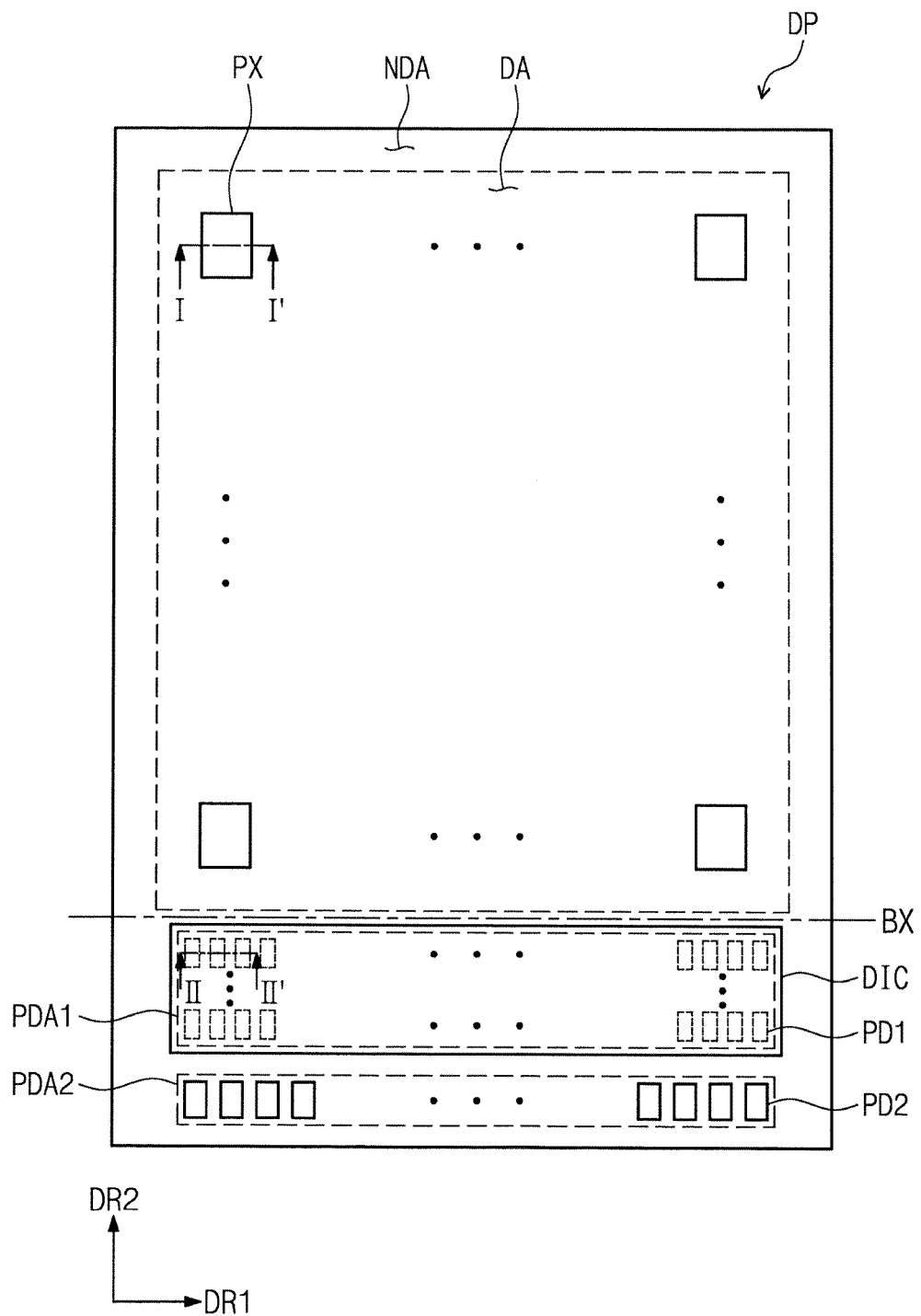
FIG. 1 is a plan view showing a display panel according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, first, second, and third directions are not necessarily limited to three axes of a rectangular coordinate system, and may be interpreted in a broader sense. For example, the first, second, and third directions may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view showing a display panel DP according to an embodiment of the present disclosure.

Referring to FIG. 1, the display panel DP includes a display area DA and a non-display area NDA. The display area DA may be defined as an area in which pixels PX are arranged to provide a user with image information. The non-display area NDA corresponding to a peripheral area of the display area DA may be defined as an area in which lines and electronic components are arranged to drive the pixels PX.

The pixels PX are arranged along a first direction DR1, and along a second direction DR2 that is substantially perpendicular to the first direction DR1, in a matrix form. In at least one embodiment, each of the pixels PX displays at least one of a red color, a green color, and a blue color. In at least one other embodiment, the pixels PX display at least one of a white color, a cyan color, and a magenta color. The pixels PX may be defined in a display part of the display panel DP. Each of the pixels PX includes a light-emitting element, and one of the colors is displayed by the light-emitting element.

The display panel DP may be a liquid crystal display panel, an organic light-emitting display panel, or an electrowetting display panel depending on the type of the pixels PX. Hereinafter, the organic light-emitting display panel will be described as the display panel DP, but the display panel DP is not limited to the organic light-emitting display panel in other embodiments.

The non-display area NDA includes a first pad part PDA1 and a second pad part PDA2. The first pad part PDA1 includes a plurality of first pads PD1. The second pad part PDA2 includes a plurality of second pads PD2.

An integrated circuit DIC is located on the first pad part PDA1. The integrated circuit DIC may be mounted on the first pad part PDA1 in a chip-on-glass (COG) method or in a chip-on-plastic (COP) method.

The integrated circuit DIC may be a source driver integrated circuit to apply a data voltage to the display area DA of the display panel DP, a scan driver integrated circuit to apply a gate voltage to the display area DA of the display panel DP, or a combination driver integrated circuit in which the source driver and the scan driver are integrated. In FIG. 1, one integrated circuit DIC is mounted on the display panel DP, but multiple integrated circuits may be mounted on the display panel DP in other embodiments.

A bending axis BX may be defined between the first pad part PDA1 and the display area DA. The display panel DP may be bent with respect to the bending axis BX.

Figure 2:
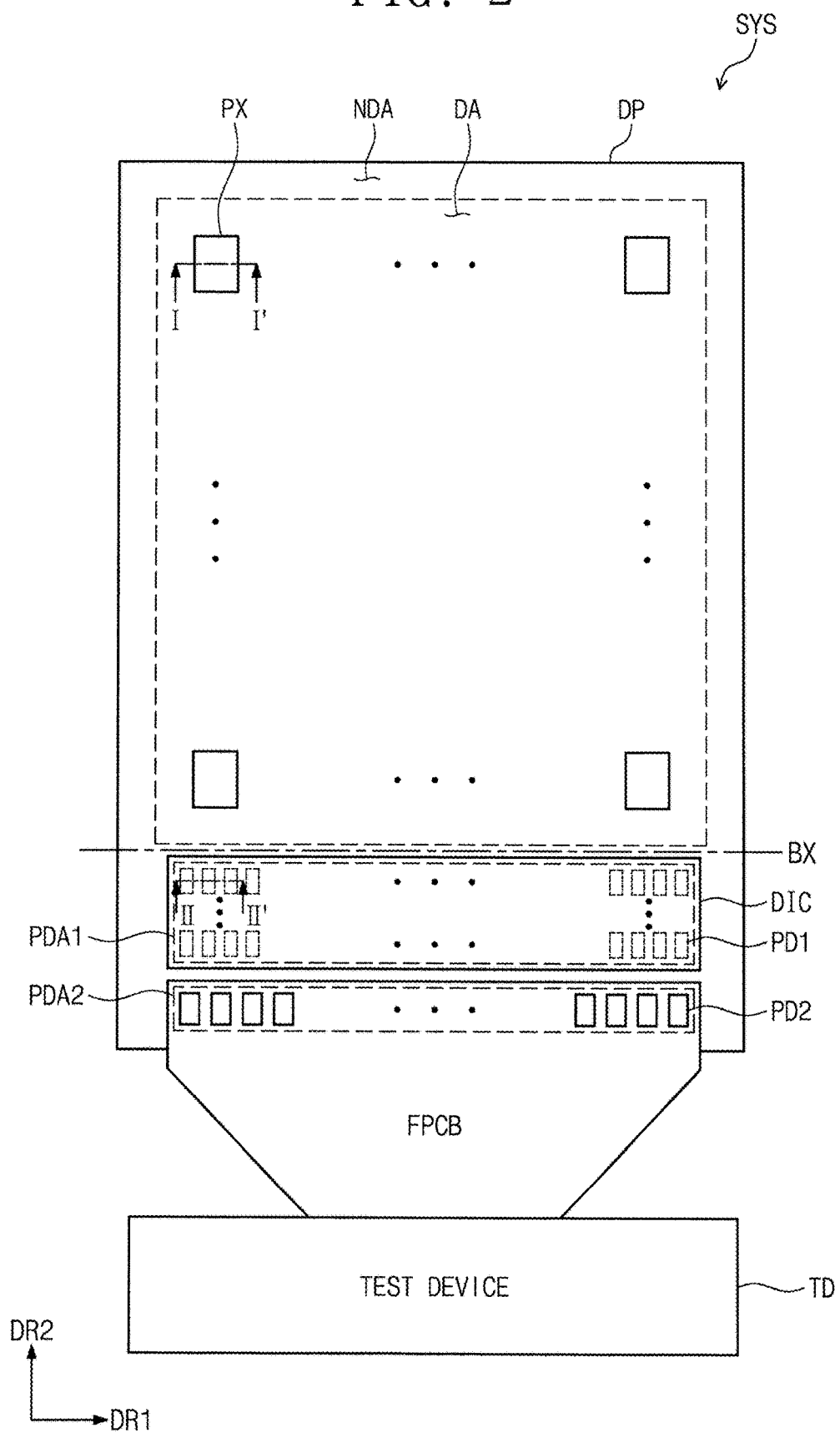
FIG. 2 is a plan view showing a display panel test system according to an embodiment of the present disclosure.

FIG. 2 is a plan view showing a display panel test system SYS according to an embodiment of the present disclosure. Referring to FIG. 2, the display panel test system SYS includes the display panel DP and a test device TD.

The display panel DP includes a printed circuit board FPCB electrically connected to the second pad part PDA2. In the present embodiment, the printed circuit board FPCB is electrically connected to the test device TD.

In the following descriptions, the term "electrical connection" may indicate not only "direct connection" between a first electronic component and a second electronic component, but may also indicate "indirect connection" between the first electronic component and the second electronic component.

The test device TD may perform a test operation on the display panel DP to measure a contact resistance between the first pad part PDA1 and the integrated circuit DIC based on a current value and a voltage value, which are measured from the second pads PD2 by applying an electrical signal to the display panel DP.

When the test operation is finished, the printed circuit board FPCB of the display panel DP may be connected to a control device that controls an operation of the display panel DP.

Figure 3:
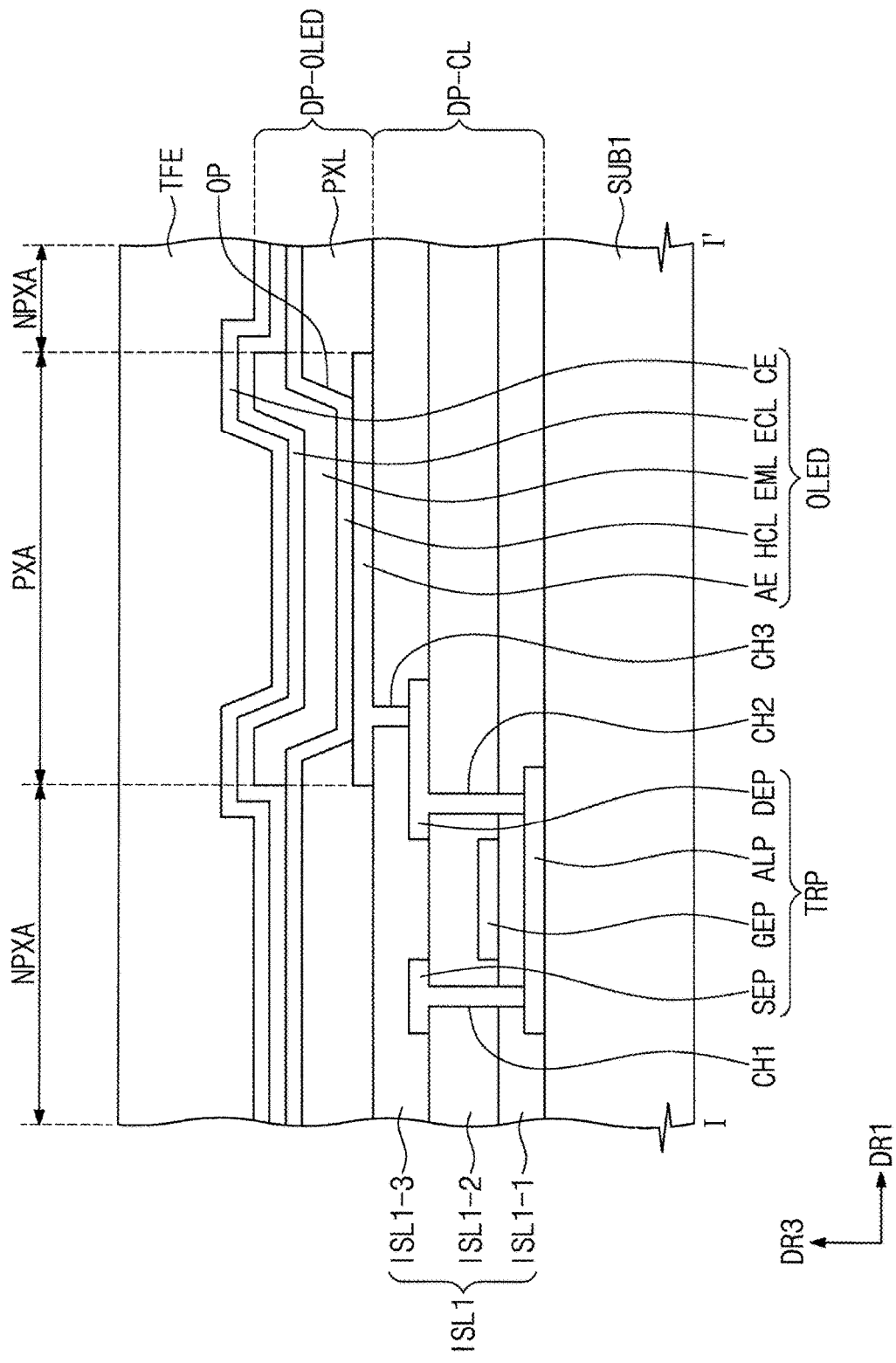
FIG. 3 is a cross-sectional view taken along the line I-I' of FIG. 1.

FIG. 3 is a cross-sectional view taken along the line I-I' of FIG. 1.

Referring to FIG. 3, the display panel DP includes a first base substrate SUB1, a first layer DP-CL, a second layer DP-OLED, and a thin film encapsulation layer TFE. The first layer DP-CL includes a plurality of conductive layers and a plurality of insulating layers, and the second layer DP-OLED includes a plurality of conductive layers and a plurality of functional organic layers.

The display area DA (refer to FIG. 1) of the display panel DP includes a light-emitting area PXA and a non-light-emitting area NPXA. The light-emitting area PXA corresponds to an area from which a light generated by an organic light-emitting device exits, or is emitted, generally in a third direction DR3. The non-light-emitting area NPXA is adjacent to the light-emitting area PXA, and corresponds to an area from which the light generated by the organic light-emitting device OLED is not emitted.

A semiconductor pattern ALP of a pixel transistor TRP is located on the first base substrate SUB1. The semiconductor pattern ALP includes amorphous silicon formed at a low temperature. In the present embodiment, the semiconductor pattern ALP may include a metal oxide semiconductor. In other embodiments, functional layers may further be located on one surface of the first base substrate SUB1. The functional layers may include at least one of a barrier layer and a buffer layer. The semiconductor pattern ALP may be located on the barrier layer or the buffer layer.

A first insulating member ISL1 may be located on the first base substrate SUB1 to cover the pixel transistor TRP. The first insulating member ISL1 may include a first insulating layer ISL1-1, a second insulating layer ISL1-2, and a third insulating layer ISL1-3.

The first insulating layer ISL1-1 is located on the first base substrate SUB1 to cover the semiconductor pattern ALP. The first insulating layer ISL1-1 includes an organic layer and/or an inorganic layer. For example, the first insulating layer ISL1-1 may include a plurality of inorganic thin film layers. The inorganic thin film layers may include a silicon nitride layer and a silicon oxide layer.

A control electrode GEP of the pixel transistor TRP is located on the first insulating layer ISL1-1.

The second insulating layer ISL1-2 is located on the first insulating layer ISL1-1 to cover the control electrode GEP. The second insulating layer ISL1-2 includes an organic layer and/or an inorganic layer. For example, the second insulating layer ISL1-2 may include a plurality of inorganic thin film layers. The inorganic thin film layers may include a silicon nitride layer and a silicon oxide layer.

A source line and a power line may be located on the second insulating layer ISL1-2. An input electrode SEP and an output electrode DEP of the pixel transistor TRP are located on the second insulating layer ISL1-2.

The input electrode SEP and the output electrode DEP are respectively connected to the semiconductor pattern ALP through a first contact hole CH1 and a second contact hole CH2, which are defined through the first insulating layer ISL1-1 and the second insulating layer ISL1-2. Meanwhile, according to another embodiment of the present disclosure, the pixel transistor TRP may have a bottom gate structure.

The third insulating layer ISL1-3 is located on the second insulating layer ISL1-2 to cover the input electrode SEP and the output electrode DEP. The third insulating layer ISL1-3 includes an organic layer and/or an inorganic layer. For example, the third insulating layer ISL1-3 may include an organic material to provide a flat surface.

A pixel definition layer PXL and the organic light-emitting device OLED are located on the third insulating layer ISL1-3. The pixel definition layer PXL is provided with an opening OP defined therethrough. The pixel definition layer PXL may serve as another insulating layer. The light-emitting area PXA and the non-light-emitting area NPXA may be distinguished from each other according to features of the pixel definition layer PXL.

An anode AE is connected to the output electrode DEP through a third contact hole CH3 defined through the third insulating layer ISL1-3. A portion of the anode AE is exposed through the opening OP of the pixel definition layer PXL. A hole control layer HCL is commonly formed in the light-emitting area PXA and the non-light-emitting area NPXA. An organic light-emitting layer EML and an electron control layer ECL are sequentially formed on the hole control layer HCL. Then, a cathode CE is commonly formed in both the light-emitting area PXA and the non-light-emitting area NPXA. The cathode CE may be formed by a deposition or by a sputtering method according to a layer structure.

The thin film encapsulation layer TFE is located on the cathode CE. The thin film encapsulation layer TFE protects the organic light-emitting device OLED from moisture and foreign substance.

Figure 4:
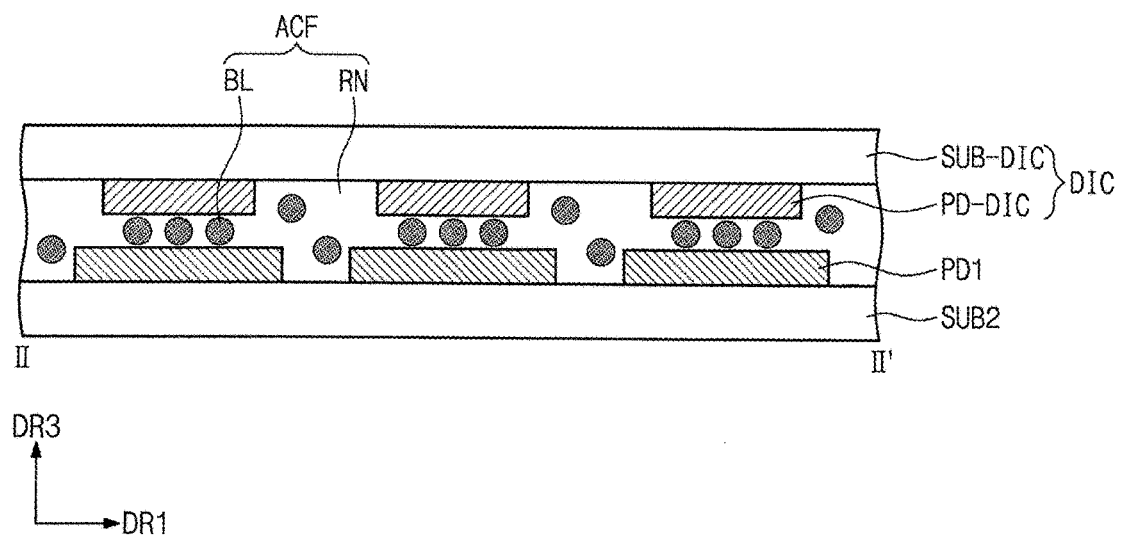
FIG. 4 is a cross-sectional view taken along the line II-II' of FIG. 1.

FIG. 4 is a cross-sectional view taken along the line II-II' of FIG. 1. Referring to FIG. 4, the first pads PD1 may be located on a second base substrate SUB2 of the display panel DP (refer to FIG. 1). The first pads PD1 include a metal material.

The integrated circuit DIC includes a base substrate SUB-DIC and pads PD-DIC located on a lower surface of the base substrate SUB-DIC. The pads PD-DIC include a metal material. Some of the pads PD-DIC may be electrically shorted with each other.

A conductive adhesive film ACF attaches the first pads PD1 to the integrated circuit DIC. The conductive adhesive film ACF may be, but is not limited to, an anisotropic conductive film.

The conductive adhesive film ACF may include a plurality of conductive balls BL and an insulating adhesive member RN.

Each of the conductive balls BL may be a conductive particle. The conductive particle may be a particle that is formed by a metal material or a metal oxide material that has an electrical conductivity, or may be a particle obtained by coating the metal material or the metal oxide material on a surface of a nucleus formed of an insulating material. As the metal material, nickel (Ni), iron (Fe), copper (Cu), aluminum (Al), tin (Sn), zinc (Zn), chromium (Cr), cobalt (Co), silver (Ag), or gold (Au) may be used.

The insulating adhesive member RN may include an insulating polymer material (e.g., an epoxy resin, an acryl resin, etc.). The epoxy resin may have a repeating structure of ether bond (—C—O—C—) with bisphenol A, and may be composed of a phenoxy polymer having an epoxy reactive group at the end thereof. The acryl resin may have a urethane linkage (—NHCO—O) connection structure and may be composed of acrylate or urethane (meta)acrylate polymer of methacrylate reactive group at the end thereof.

Referring to FIG. 2, the test device TD may measure the contact resistance of the first pad PD1, the conductive ball BL, and the pad PD-DIC of the integrated circuit DIC.

Figure 5:
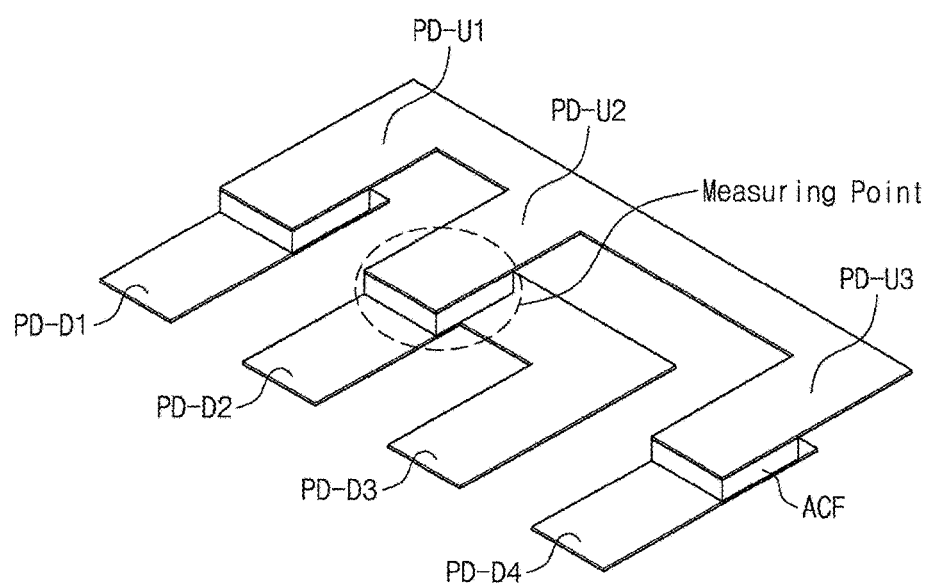
FIG. 5 is a perspective view showing an aspect of measuring a contact resistance.

FIG. 5 is a perspective view showing an aspect of measuring the contact resistance.

FIG. 5 shows lower pads PD-D1, PD-D2, PD-D3, and PD-D4 attached to upper pads PD-U1, PD-U2, and PD-U3 by the conductive adhesive film ACE.

The lower pads PD-D1, PD-D2, PD-D3, and PD-D4 include a first lower pad PD-D1, a second lower pad PD-D2, a third lower pad PD-D3, and a fourth lower pad PD-D4. The upper pads PD-U1, PD-U2, and PD-U3 include a first upper pad PD-U1, a second upper pad PD-U2, and a third upper pad PD-U3.

Hereinafter, the method of measuring the contact resistance between the second lower pad PD-D2 and the second upper pad PD-U2 will be described. When the second lower pad PD-D2 is grounded and a current is applied to the first lower pad PD-D1, a current flowing through a measuring point may be measured. In addition, when a voltage between the third lower pad PD-D3 and the fourth lower pad PD-D4 is measured, a voltage between the second lower pad PD-D2 and the second upper pad PD-U2 may be measured at the measuring point. As described above, when the current and the voltage are measured at the measuring point, the contact resistance may be calculated according to a relationship governed by the equation V=IR.

Figure 6A:
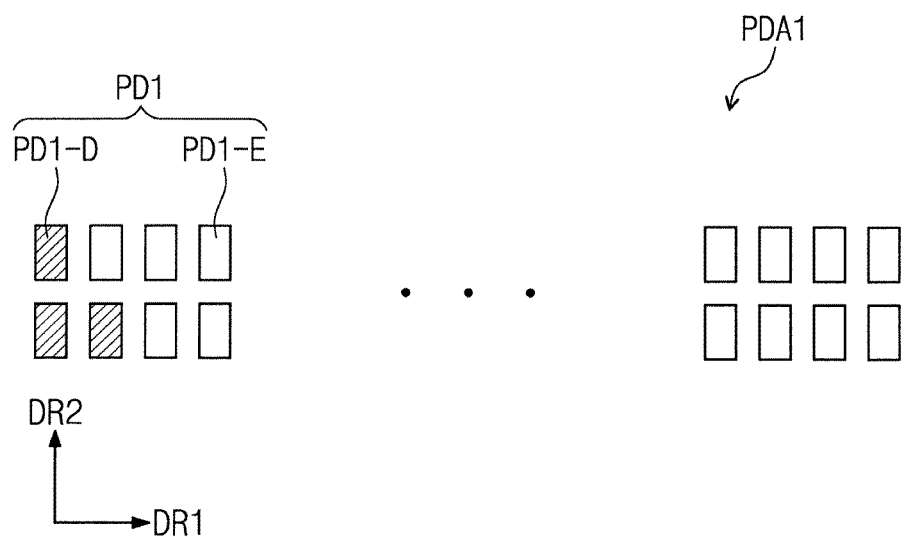
FIG. 6A is a view showing first pads of a first pad part according to an embodiment of the present disclosure.
Figure 6B:
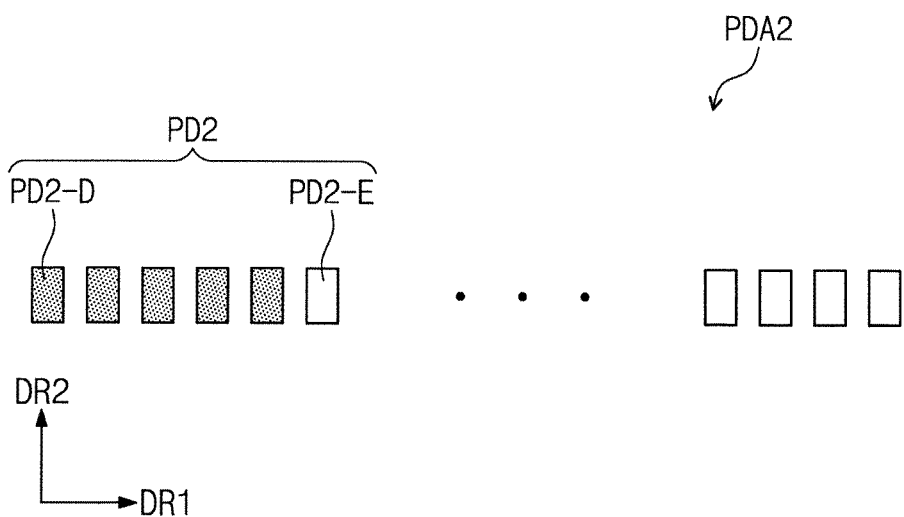
FIG. 6B is a view showing second pads of a second pad part according to an embodiment of the present disclosure.

FIG. 6A is a view showing the first pads PD1 of the first pad part PDA1 according to an embodiment of the present disclosure. FIG. 6B is a view showing the second pads PD2 of the second pad part PDA2 according to an embodiment of the present disclosure. In the present embodiment, the first pads PD1 may be aligned in two rows.

The first pads PD1 include first effective pads PD1-E and first measuring pads PD1-D. The first effective pads PD1-E are electrically connected to the pixels PX (refer to FIG. 1). Here, the term "electrically connected" may indicate not only a structure in which the first effective pads PD1-E are directly connected to the pixels PX (refer to FIG. 1), but may also indicate a structure in which the first effective pads PD1-E are connected to the pixels PX (refer to FIG. 1) through the integrated circuit DIC.

The first effective pads PD1-E transfer a signal from the integrated circuit DIC (refer to FIG. 1) to the pixels PX (refer to FIG. 1). The first measuring pads PD1-D are insulated from the pixels PX (refer to FIG. 1). The first measuring pads PD1-D are pads to measure the contact resistance using the test device TD (refer to FIG. 2). In FIG. 6A, the first measuring pads PD1-D are arranged in one side portion, but they are not limited thereto or thereby in other embodiments. In addition, FIG. 6A shows three first measuring pads PD1-D, but the number of the first measuring pads PD1-D is not limited to three.

Referring to FIG. 6B, the second pads PD2 include second effective pads PD2-E and second measuring pads PD2-D. The second effective pads PD2-E are electrically connected to the first effective pads PD1-E. The second measuring pads PD2-D are electrically connected to the first measuring pads PD1-D.

In FIG. 6B, the second measuring pads PD2-D are arranged in one side portion, but they should not be limited thereto or thereby in other embodiments. In addition, FIG. 6B shows five second measuring pads PD2-D, but the number of the second measuring pads PD2-D should not be limited to five.

Figure 7:
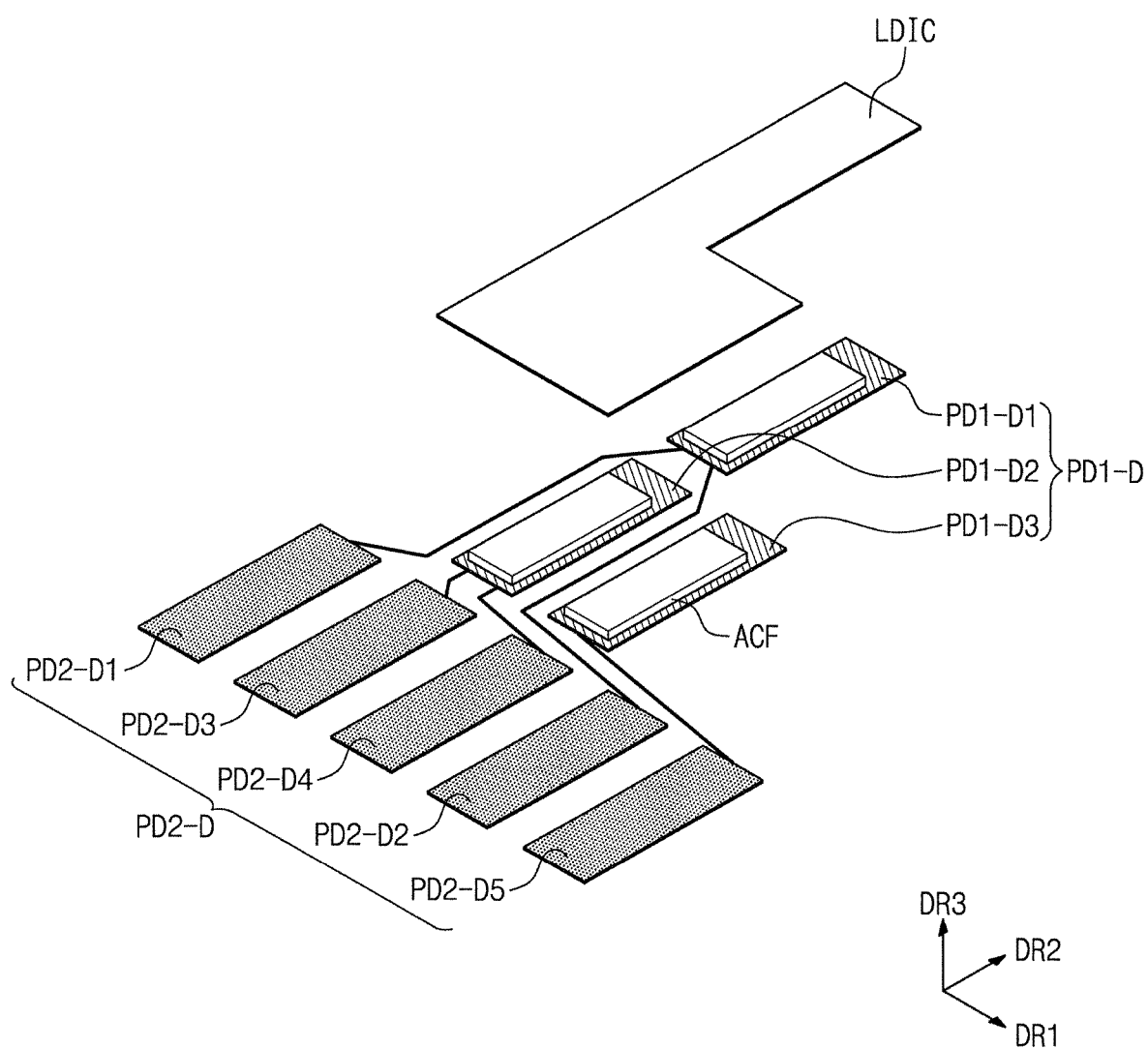
FIG. 7 is an exploded perspective view showing a structure in which measuring pads are connected to an internal line of an integrated circuit according to an embodiment of the present disclosure.

FIG. 7 is an exploded perspective view showing a structure in which the measuring pads PD1-D and PD2-D are connected to an internal line LDIC of the integrated circuit DIC according to an embodiment of the present disclosure.

The first measuring pads PD1-D may be referred to as test pads PD1-D because the contact resistance is measured by the test device TD (refer to FIG. 2). A test pad part may be defined by an area including the test pads PD1-D.

The second measuring pads PD2-D may be referred to as input pads PD2-D because the second measuring pads PD2-D are used to input signals generated by the test device TD (refer to FIG. 2) to the test pads PD1-D. An input pad part may be defined by an area including the input pads PD2-D.

The test pads PD1-D include a first test pad PD1-D1, a second test pad PD1-D2, and a third test pad PD1-D3.

The input pads PD2-D include a first input pad PD2-D1, a second input pad PD2-D2, a third input pad PD2-D3, a fourth input pad PD2-D4, and a fifth input pad PD2-D5.

The first test pad PD1-D1 may be electrically connected to the first input pad PD2-D1 and the second input pad PD2-D2. The second test pad PD1-D2 may be electrically connected to the third input pad PD2-D3 and the fourth input pad PD2-D4. The third test pad PD1-D3 (which may be referred to as a third measuring pad) may be electrically connected to the fifth input pad PD2-D5 (which may be referred to as a fourth measuring pad).

The conductive adhesive film ACF is located on the test pads PD1-D. The internal line LDIC of the integrated circuit DIC is located on the conductive adhesive film ACF. The internal line LDIC may be formed by the short between some of the pads PD-DIC of the integrated circuit DIC. The internal line LDIC is attached to the test pads PD1-D by the conductive adhesive film ACF. The internal line LDIC is insulated from other lines of the integrated circuit DIC.

Referring to FIGS. 5 and 7, two input pads among the input pads PD2-D are used to measure the current, and two other input pads among the input pads PD2-D are used to measure the voltage. The signal applied to each of the input pads PD2-D should not be limited to one signal. The test pad PD1-D, to be measured through each of the input pads PD2-D, should not be limited to only one.

Figure 8A:
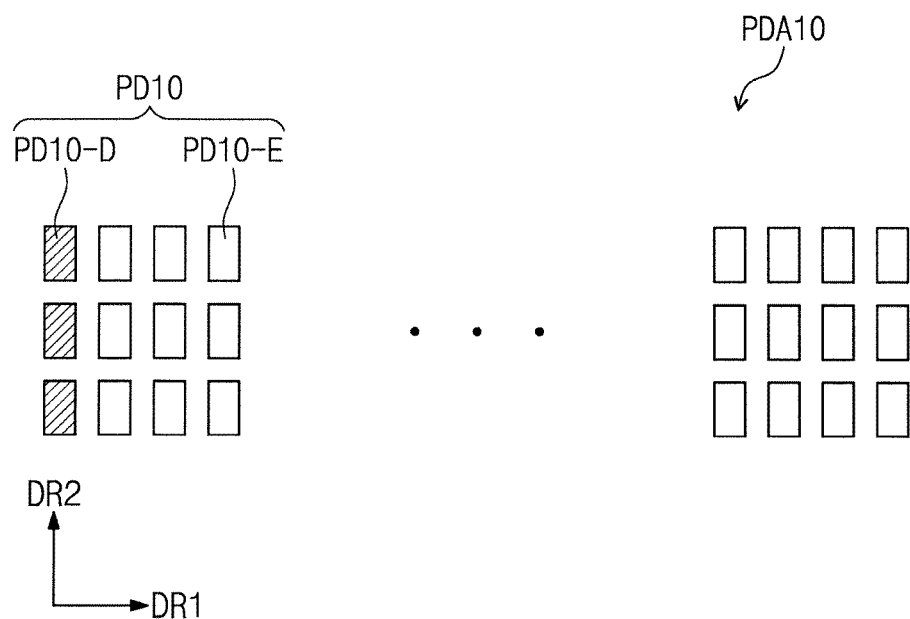
FIG. 8A is a view showing first pads of a first pad part according to an embodiment of the present disclosure.
Figure 8B:
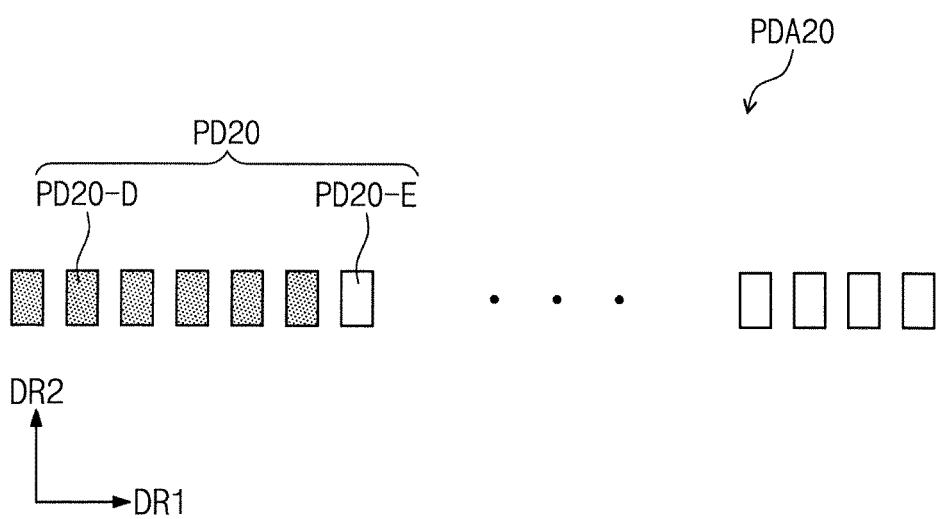
FIG. 8B is a view showing second pads of a second pad part according to an embodiment of the present disclosure.

FIG. 8A is a view showing first pads PD10 of a first pad part PDA10 according to an embodiment of the present disclosure. FIG. 8B is a view showing second pads PD20 of a second pad part PDA20 according to an embodiment of the present disclosure.

The first pads PD10 include first effective pads PD10-E and first measuring pads PD10-D. The first pads PD10 have the same structure and function as those of the first pads PD1 described with reference to FIG. 6A, and thus repeated details thereof will be omitted.

In FIG. 8A, the first measuring pads PD10-D are arranged in one side portion, but they should not be limited thereto or thereby. In addition, FIG. 8A shows three first measuring pads PD10-D, but the number of the first measuring pads PD10-D should not be limited to three.

In FIG. 0.8B, the second pads PD20 include second effective pads PD20-E and second measuring pads PD20-D. The second pads PD20 have the same structure and function as those of the second pads PD2 described with reference to FIG. 6B, and thus details thereof will be omitted.

FIG. 8B shows six second measuring pads PD20-D, but the number of the second measuring pads PD20-D should not be limited to six.

Figure 9A:
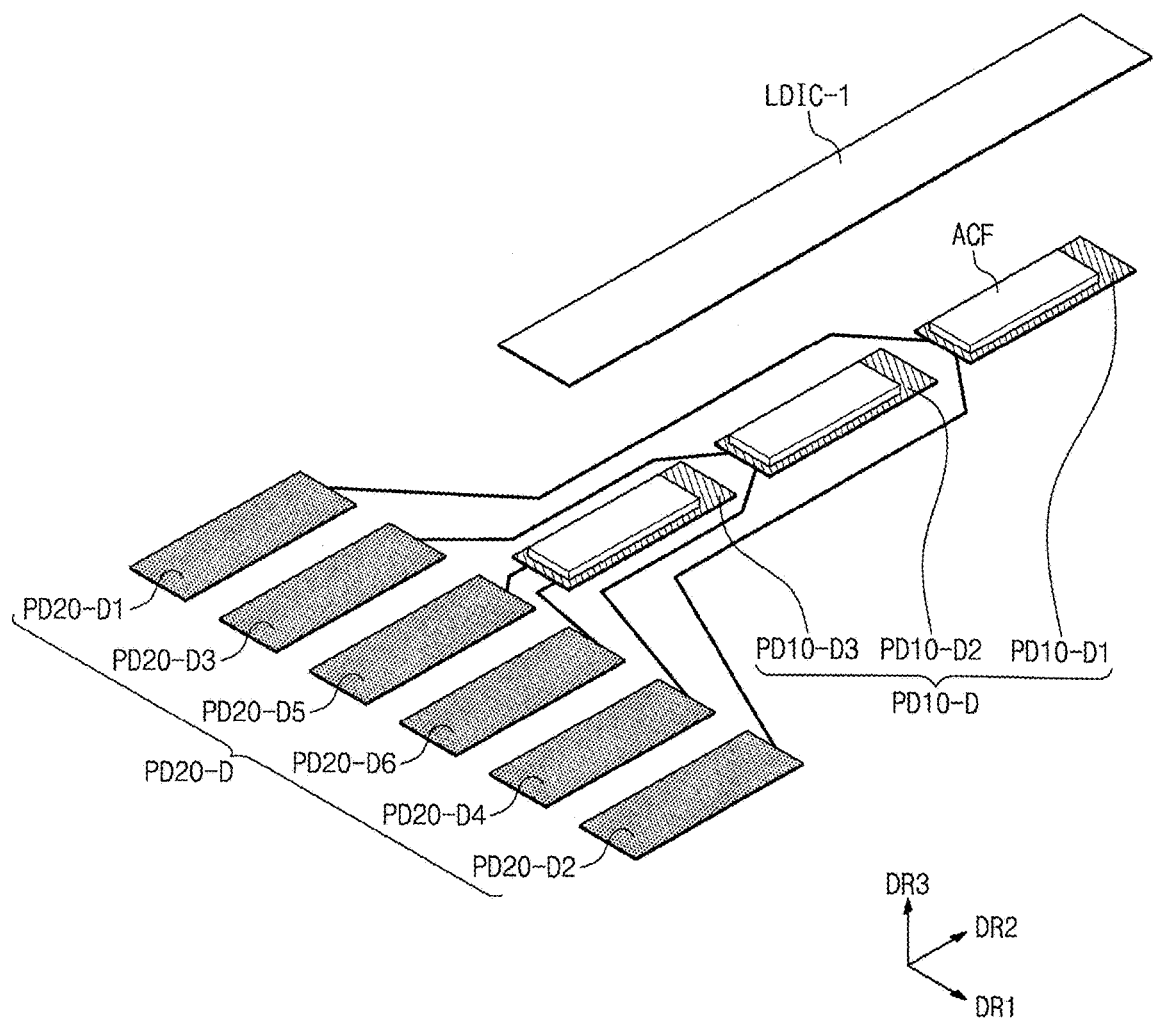
FIGS. 9A and 9B are exploded perspective views showing structures in which measuring pads are connected to an internal line of an integrated circuit according to an embodiment of the present disclosure.
Figure 9B:
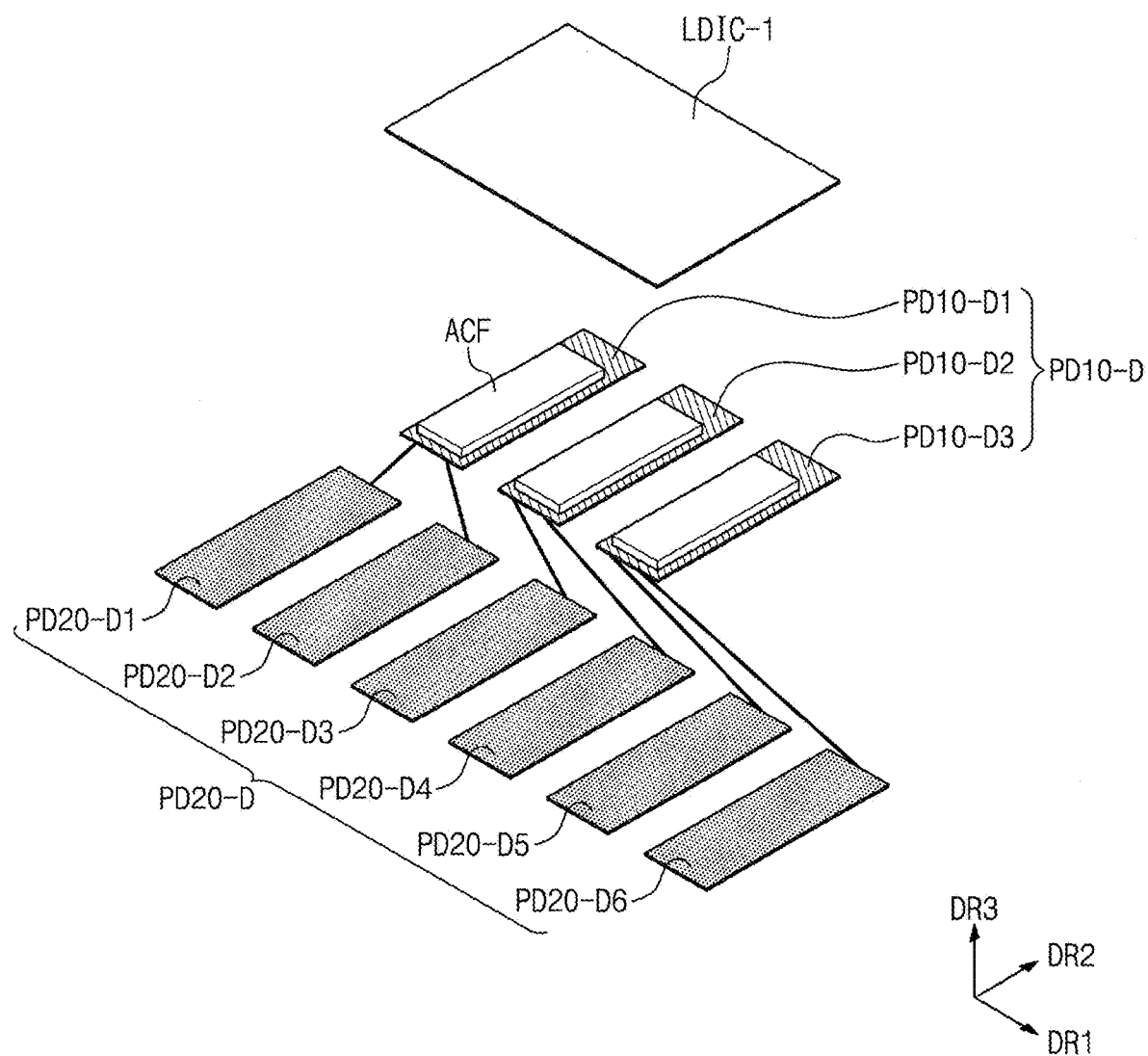

FIGS. 9A and 9B are exploded perspective views showing structures in which the measuring pads PD10-D and PD20-D are connected to an internal line LDIC-1 of an integrated circuit DIC according to an embodiment of the present disclosure.

The first measuring pads PD10-D may be referred to as test pads PD10-D because the contact resistance is measured by the test device TD (refer to FIG. 2). A test pad part may be defined by an area including the test pads PD10-D.

The second measuring pads PD20-D may be referred to as input pads PD20-D because the second measuring pads PD20-D are used to input signals generated by the test device TD (refer to FIG. 2) to the test pads PD10-D. An input pad part may be defined by an area including the input pads PD20-D.

In FIG. 9A, the test pads PD10-D are arranged in the second direction DR2, and the test pads PD10-D are arranged in the first direction DR1 in FIG. 9B.

The test pads PD10-D include a first test pad PD10-D1, a second test pad PD10-D2, and a third test pad PD10-D3.

The input pads PD20-D include a first input pad PD20-D1, a second input pad PD20-D2, a third input pad PD20-D3, a fourth input pad PD20-D4, a fifth input pad PD20-D5, and a sixth input pad PD20-D6.

The first test pad PD10-D1 may be electrically connected to the first input pad PD20-D1 and the second input pad PD20-D2. The second test pad PD10-D2 may be electrically connected to the third input pad PD20-D3 and the fourth input pad PD20-D4. The third test pad PD10-D3 may be electrically connected to the fifth input pad PD20-D5 and the sixth input pad PD20-D5.

The conductive adhesive film ACF is located on the test pads PD10-D. The internal line LDIC-1 of the integrated circuit DIC is located on the conductive adhesive film ACF. The internal line LDIC-1 may be formed by the short between some of the pads PD-DIC of the integrated circuit DIC. The internal line LDIC-1 is attached to the test pads PD10-D by the conductive adhesive film ACF. The internal line LDIC-1 is insulated from other lines of the integrated circuit DIC.

The contact resistance of each of the test pads PD10-D may be measured by using the following relations as shown in Table 1 below.

TABLE 1

| Measuring point | Current measurement | | Voltage measurement | |
|---|---|---|---|---|
| | Connection 1 | Connection 2 | Connection 1 | Connection 2 |
| First test pad | First input pad | Third or fourth input pad | Second input pad | Fifth or sixth input pad |
| | First input pad | Fifth or sixth input pad | Second input pad | Third or fourth input pad |
| | Second input pad | Third or fourth input pad | First input pad | Fifth or sixth input pad |
| | Second input pad | Fifth or sixth input pad | First input pad | Third or fourth input pad |
| Second test pad | Third input pad | First or second input pad | Fourth input pad | Fifth or sixth input pad |
| | Third input pad | Fifth or sixth input pad | Fourth input pad | First or second input pad |
| | Fourth input pad | First or second input pad | Third input pad | Fifth or sixth input pad |
| | Fourth input pad | Fifth or sixth input pad | Third input pad | First or second input pad |
| Third test pad | Fifth input pad | First or second input pad | Sixth input pad | Third or fourth input pad |
| | Fifth input pad | Third or fourth input pad | Sixth input pad | First or second input pad |
| | Sixth input pad | First or second input pad | Fifth input pad | Third or fourth input pad |
| | Sixth input pad | Third or fourth input pad | Fifth input pad | First or second input pad |

For instance, the current flowing between the first input pad PD20-D1 and the third input pad PD20-D3, and the voltage between the second input pad PD20-D2 and the fifth input pad PD20-D5, may be measured to check the contact resistance at a point corresponding to the first test pad PD10-D1 among the measuring points. In this case, because the first input pad PD20-D1 is grounded and the current is applied to the third input pad PD20-D3, the current flowing through the point corresponding to the first test pad PD10-D1 may be measured. When the voltage between the second input pad PD20-D2 and the fifth input pad PD20-D5 is measured, the voltage at the point corresponding to the first test pad PD10-D1 may be measured. As described above, the contact resistance may be calculated by measuring the current and the voltage at the point corresponding to the first test pad PD10-D1.

Figure 10A:
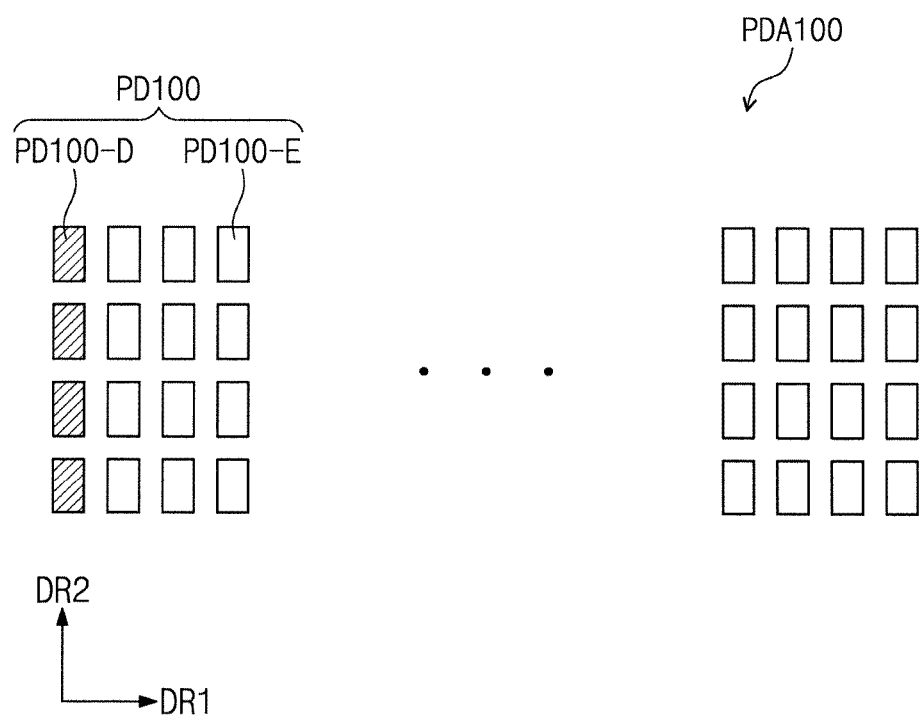
FIG. 10A is a view showing first pads of a first pad part according to an embodiment of the present disclosure.
Figure 10B:
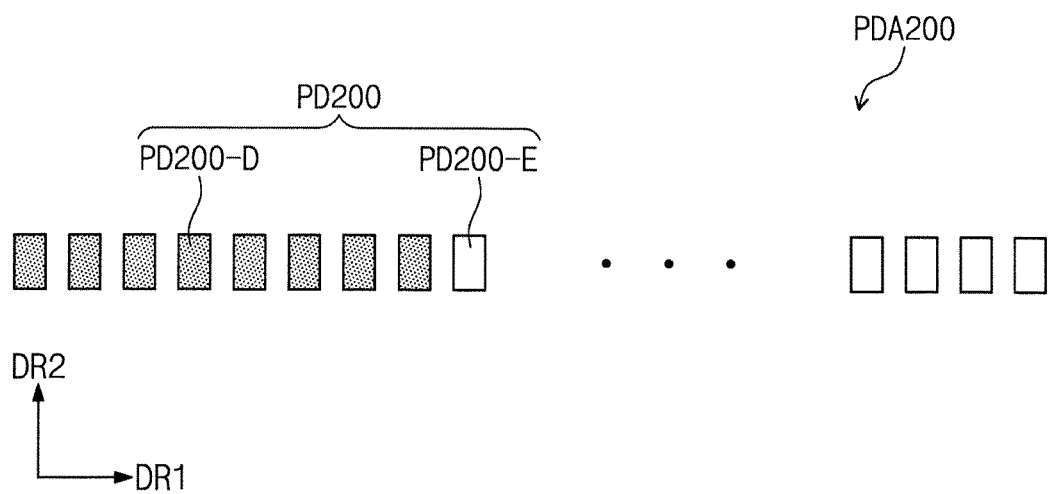
FIG. 10B is a view showing second pads of a second pad part according to an embodiment of the present disclosure.

FIG. 10A is a view showing first pads PD100 of a first pad part PDA100 according to an embodiment of the present disclosure. FIG. 10B is a view showing second pads PD200 of a second pad part PDA200 according to an embodiment of the present disclosure. In the present embodiment, the first pads PD100 may be arranged in four rows.

The first pads PD100 include first effective pads PD100-E and first measuring pads PD100-D. The first pads PD100 have the same structure and function as those of the first pads PD1 described with reference to FIG. 6A, and thus repeated details thereof will be omitted.

In FIG. 10A, the first measuring pads PD100-D are arranged in one side portion, but they should not be limited thereto or thereby. In addition, FIG. 10A shows four first measuring pads PD100-D, but the number of the first measuring pads PD100-D should not be limited to four.

In FIG. 10B, the second pads PD200 include second effective pads PD200-E and second measuring pads PD200-D. The second pads PD200 have the same structure and function as those of the second pads PD2 described with reference to FIG. 6B, and thus repeated details thereof will be omitted.

FIG. 10B shows eight second measuring pads PD200-D, but the number of the second measuring pads PD200-D should not be limited to eight.

Figure 11:
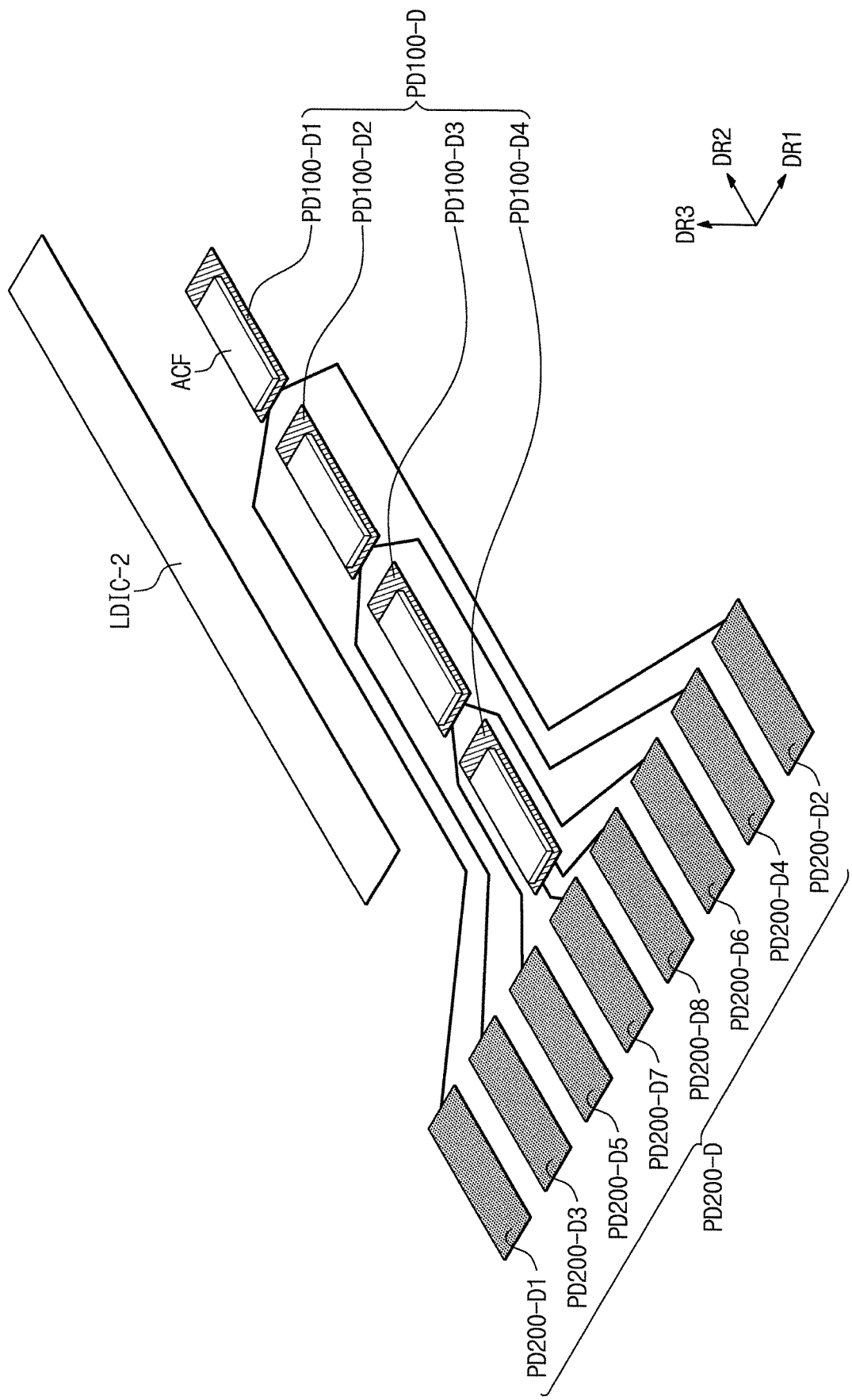
FIG. 11 is an exploded perspective view showing a structure in which measuring pads are connected to internal lines of an integrated circuit according to an embodiment of the present disclosure.

FIG. 11 is an exploded perspective view showing a structure in which the measuring pads PD100-D and PD200-D are connected to an internal line LDIC-2 of an integrated circuit DIC according to an embodiment of the present disclosure.

The first measuring pads PD100-D may be referred to as test pads PD100-D because they may enable the contact resistance to be measured by the test device TD (refer to FIG. 2). A test pad part may be defined by an area including the test pads PD100-D.

The second measuring pads PD200-D may be referred to as input pads PD200-D because the second measuring pads PD200-D are used to input signals generated by the test device TD (refer to FIG. 2) to the test pads PD100-D. An input pad part may be defined by an area including the input pads PD200-D.

In FIG. 11, the test pads PD100-D are arranged along the second direction DR2, but the direction in which the test pads PD100-D are arranged should not be limited to the second direction DR2.

The test pads PD100-D include a first test pad PD100-D1, a second test pad PD100-D2, a third test pad PD100-D3, and a fourth test pad PD100-D4.

The input pads PD200-D include a first input pad PD200-D1, a second input pad PD200-D2, a third input pad PD200-D3, a fourth input pad PD200-D4, a fifth input pad PD200-D5, a sixth input pad PD200-D6, a seventh input pad PD200-D7, and an eighth input pad PD200-D8.

The first test pad PD100-D1 may be electrically connected to the first input pad PD200-D1 and the second input pad PD200-D2. The second test pad PD100-D2 may be electrically connected to the third input pad PD200-D3 and the fourth input pad PD200-D4. The third test pad PD100-D3 may be electrically connected to the fifth input pad PD200-D5 and the sixth input pad PD200-D6. The fourth test pad PD100-D4 may be electrically connected to the seventh input pad PD200-D7 and the eighth input pad PD200-D8.

The conductive adhesive film ACF is located on the test pads PD100-D. The internal line LDIC-2 of the integrated circuit DIC is located on the conductive adhesive film ACF. The internal line LDIC-2 may be formed by the short between some of the pads PD-DIC of the integrated circuit DIC. The internal line LDIC-2 is attached to the test pads PD100-D by the conductive adhesive film ACF. The internal line LDIC-2 is insulated from other lines of the integrated circuit DIC.

According to embodiments of the present disclosure, in a case that the number of the test pads (or the second measuring pads) that are to be measured is n (n being a natural number equal to or greater than 3), the number of the input pads (or the first measuring pads) that are suitable may be 2n. That is, six input pads are suitable for measuring the contact resistance at three points, eight input pads are suitable for measuring the contact resistance at four points, and ten input pads are suitable for measuring the contact resistance at five points. However, the number of the points that are to be measured, and the number of suitable input pads, may be changed.

Although the embodiments of the present invention have been described, it is understood that the present invention should not be limited to these embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims with functional equivalents thereof to be included.

What is claimed is:

1. A display panel comprising:
   a plurality of light-emitting elements;
   a first pad part comprising:
      a plurality of first effective pads electrically connected to the light-emitting elements; and
      n (n being a natural number equal to or greater than 2) first measuring pads insulated from the light-emitting elements;
   a conductive adhesive film on the first pad part and comprising a plurality of conductive balls;
   an integrated circuit on the conductive adhesive film, and comprising an internal line electrically connected to the first measuring pads by the conductive balls; and
   a second pad part comprising:
      a plurality of second effective pads electrically connected to the first effective pads; and
      2n second measuring pads electrically connected to the first measuring pads,
      wherein each of the first measuring pads is electrically connected to two respective ones of the second measuring pads.

2. The display panel of claim 1, wherein the integrated circuit is configured to apply an electrical signal to the light-emitting elements.

3. The display panel of claim 2, wherein the integrated circuit is mounted by a chip-on-glass (COG) method or a chip-on-plastic (COP) method.

4. The display panel of claim 3, further comprising a printed circuit board electrically connected to the second pad part.

5. The display panel of claim 4, wherein the printed circuit board is mounted by the chip-on-glass (COG) method or the chip-on-plastic (COP) method.

6. The display panel of claim 1, wherein n is equal to 2,
wherein the first pad part further comprises a third measuring pad electrically connected to the internal line, and
wherein the second pad part further comprises a fourth measuring pad electrically connected to the third measuring pad.

7. The display panel of claim 1, wherein n is equal to 3.

8. The display panel of claim 1, wherein n is equal to 4.

9. The display panel of claim 1, wherein the first effective pads and the first measuring pads are arranged in three rows.

10. The display panel of claim 1, wherein the first effective pads and the first measuring pads are arranged in four rows.

11. The display panel of claim 1, wherein a bending axis is defined between the first pad part and the light-emitting elements, and
wherein the display panel is bent with respect to the bending axis.

12. The display panel of claim 1, wherein the internal line is insulated from other lines in the integrated circuit.

13. The display panel of claim 1, wherein each of the light-emitting elements comprises an organic light-emitting layer.

14. A display panel test system comprising:
a display panel comprising:
a plurality of light-emitting elements;
a test pad part comprising test pads insulated from the light-emitting elements, the test pads comprising:
a first test pad;
a second test pad; and
a third test pad;
a conductive adhesive film on the test pads, and comprising a plurality of conductive balls;
an integrated circuit on the conductive adhesive film, and comprising an internal line electrically connected to the test pads by the conductive balls; and
an input pad part comprising input pads electrically connected to the test pads, the input pads comprising:
a first input pad electrically connected to the first test pad;
a second input pad electrically connected to the first test pad;
a third input pad electrically connected to the second test pad;
a fourth input pad electrically connected to the second test pad;
a fifth input pad electrically connected to the third test pad; and
a sixth input pad electrically connected to the third test pad; and
a test device electrically connected to the input pads to measure a contact resistance of the test pads, the conductive adhesive film, and the internal line.

15. The display panel test system of claim 14, wherein the test device is configured to apply a current between two of the input pads, and is configured to measure a voltage between two others of input pads.

16. The display panel test system of claim 14, wherein the test device is configured to:
apply a current between the first input pad and the third input pad, and measure a voltage between the second input pad and the fifth input pad to measure the contact resistance of the first test pad, the conductive adhesive film, and the internal line
apply a current between the third input pad and the first input pad, and measure the voltage between the fourth input pad and the fifth input pad to measure the contact resistance of the second test pad, the conductive adhesive film, and the internal line; and
apply a current between the fifth input pad and the first input pad, and measure the voltage between the sixth input pad and the third input pad to measure the contact resistance of the third test pad, the conductive adhesive film, and the internal line.

* * * * *